United States Patent
Jung et al.

(10) Patent No.: US 10,854,709 B2
(45) Date of Patent: Dec. 1, 2020

(54) SEMICONDUCTOR DEVICE AND METHOD OF MANUFACTURING THE SAME

(71) Applicant: SAMSUNG ELECTRONICS CO., LTD., Suwon-si (KR)

(72) Inventors: Kyooho Jung, Seoul (KR); Sangyeol Kang, Yongin-si (KR); Kyuho Cho, Seoul (KR); Eunsun Kim, Suwon-si (KR); Hyosik Mun, Hwaseong-si (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 0 days.

(21) Appl. No.: 16/392,097

(22) Filed: Apr. 23, 2019

(65) Prior Publication Data
US 2020/0091278 A1    Mar. 19, 2020

(30) Foreign Application Priority Data

Sep. 19, 2018  (KR) .................. 10-2018-0112262

(51) Int. Cl.
*H01L 21/02*   (2006.01)
*H01L 49/02*   (2006.01)

(52) U.S. Cl.
CPC ........ *H01L 28/90* (2013.01); *H01L 21/02356* (2013.01)

(58) Field of Classification Search
None
See application file for complete search history.

(56) References Cited

U.S. PATENT DOCUMENTS

| | | | |
|---|---|---|---|
| 7,989,877 B2 | 8/2011 | Lim et al. | |
| 8,698,221 B2 | 4/2014 | Park et al. | |
| 8,790,986 B2 | 7/2014 | Choi et al. | |
| 8,859,383 B2 | 10/2014 | Kim et al. | |
| 9,455,259 B2 | 9/2016 | Lim et al. | |
| 9,520,460 B2 | 12/2016 | Lee et al. | |
| 9,716,094 B2 | 7/2017 | Kang et al. | |
| 9,893,142 B2 | 2/2018 | Ahn et al. | |
| 2008/0203529 A1* | 8/2008 | Kang | H01L 28/40 257/532 |
| 2011/0102968 A1 | 5/2011 | Choi et al. | |
| 2013/0119512 A1* | 5/2013 | Malhotra | H01L 27/10852 257/532 |
| 2015/0061074 A1* | 3/2015 | Lee | H01L 28/90 257/532 |
| 2017/0004967 A1* | 1/2017 | Kil | H01L 21/02181 |
| 2018/0158688 A1 | 6/2018 | Chen et al. | |
| 2018/0182760 A1* | 6/2018 | Lin | H01L 27/10814 |
| 2018/0315811 A1* | 11/2018 | Cho | H01L 28/91 |

FOREIGN PATENT DOCUMENTS

KR    10-1741573 B1    6/2017

* cited by examiner

*Primary Examiner* — Benjamin P Sandvik
(74) *Attorney, Agent, or Firm* — Lee IP Law, PC

(57) ABSTRACT

A method of manufacturing a semiconductor device includes forming a first electrode, forming a preliminary dielectric layer on the first electrode, forming a second electrode on the preliminary dielectric layer, and at least partially phase-changing the preliminary dielectric layer to form a dielectric layer. An interfacial energy between the first electrode and the dielectric layer may be less than an interfacial energy between the first electrode and the preliminary dielectric layer.

19 Claims, 10 Drawing Sheets

SEMICONDUCTOR DEVICE AND METHOD OF MANUFACTURING THE SAME

CROSS-REFERENCE TO RELATED APPLICATION

Korean Patent Application No. 10-2018-0112262 filed on Sep. 19, 2018 in the Korean Intellectual Property Office, and entitled: "Semiconductor Device and Method of Manufacturing the Same," is incorporated by reference herein in its entirety.

BACKGROUND

1. Field

Embodiments relate to a semiconductor device and a method of manufacturing the same.

2. Description of the Related Art

In the current industry, semiconductor devices are used in many electronic products, and may exhibit multi-functionality, compactness, low power consumption, and the like. Semiconductor devices may be composed of various material layers such as semiconductor layers, conductive layers, and dielectric layers.

SUMMARY

Embodiments are directed to a method of manufacturing a semiconductor device, including forming a first electrode, forming a preliminary dielectric layer on the first electrode, forming a second electrode on the preliminary dielectric layer, and at least partially phase-changing the preliminary dielectric layer to form a dielectric layer. An interfacial energy between the first electrode and the dielectric layer may be less than an interfacial energy between the first electrode and the preliminary dielectric layer.

Embodiments are also directed to a semiconductor device, including a first electrode, a second electrode on the first electrode, and a dielectric layer between the first electrode and the second electrode. The dielectric layer may include a first portion adjacent to the first electrode, and a second portion adjacent to the second electrode. The first portion and the second portion may have different crystalline phases from each other.

BRIEF DESCRIPTION OF THE DRAWINGS

Features will become apparent to those of skill in the art by describing in detail example embodiments with reference to the attached drawings in which.

DETAILED DESCRIPTION

Example embodiments will now be described with reference to the drawings.

FIGS. 1 to 4 illustrate cross-sectional views showing a method of manufacturing a semiconductor device according to an example embodiment.

Figure 1:
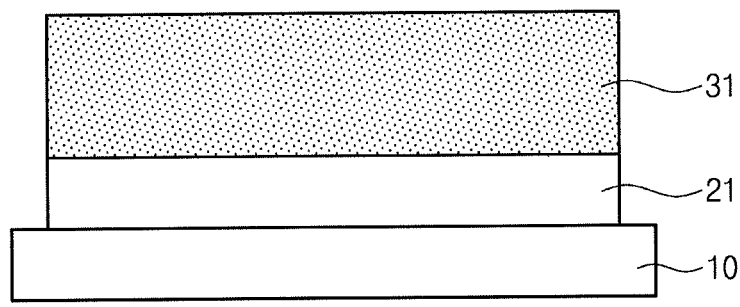
FIGS. 1 to 4 illustrate cross-sectional views showing a method of manufacturing a semiconductor device according to an example embodiment.

Referring to FIG. 1, a semiconductor substrate 10 may be provided. The semiconductor substrate 10 may be a semiconductor wafer (e.g., a silicon wafer) including a variety of semiconductor components. For example, the semiconductor substrate 10 may include a lower structure that corresponds to the semiconductor components. The lower structure may include a contact pad, a conductive pattern, an electrical line, a gate structure, a transistor, or the like. The lower structure may include, for example, a memory circuit, a logic circuit, or a combination thereof. The semiconductor substrate 10 may further be provided on its top surface with a dielectric layer covering the semiconductor components.

A first electrode 21 may be formed on the semiconductor substrate 10. The first electrode 21 may be formed by an atomic layer deposition process, a sputtering process, an electron beam deposition process, a chemical vapor deposition process, a pulsed laser deposition process, or the like. The first electrode 21 may be disposed on the dielectric layer formed on the semiconductor substrate 10. The first electrode 21 may be formed to have various shapes such as a plate shape, a cylindrical shape, or a stack shape. In an example embodiment, the first electrode 21 may include niobium nitride (NbN).

A preliminary dielectric layer 31 may be formed on the first electrode 21. A deposition process may be performed to form the preliminary dielectric layer 31. The preliminary dielectric layer 31 may include hafnium oxide ($HfO_2$). For example, the preliminary dielectric layer 31 may include an undoped hafnium oxide layer. The preliminary dielectric layer 31 may be formed by a sputtering process, a pulsed laser deposition process, an electron beam deposition process, or the like. In another implementation, the preliminary dielectric layer 31 may be formed by an atomic layer deposition process that uses a hafnium source gas and a reaction gas. The hafnium source gas may include hafnium (Hf) atoms. The reaction gas may include oxygen atoms. For example, the reaction gas may include one or more of a vapor, an ozone ($O_3$) gas, a reactive oxygen ($O_2$) gas, or a nitrous oxide ($N_2O$) gas. The atomic layer deposition process may be carried out at a process temperature of about 200° C. to about 300° C. The preliminary dielectric layer 31 may be deposited by a deposition cycle that is repeated one or more times. The number of times of the deposition cycle may determine a thickness of the preliminary dielectric layer 31. The preliminary dielectric layer 31 may be formed to have a thickness of about 1 nm to about 10 nm. The preliminary dielectric layer 31 may have a monoclinic crystalline phase or an amorphous phase. In another implementation, a portion of the preliminary dielectric layer 31 may have a monoclinic crystalline phase, and another portion of the preliminary dielectric layer 31 may have an amorphous phase.

The following will discuss an example of the deposition cycle. The deposition cycle may include a hafnium cycle, which may be repeated one or more times. The hafnium cycle may include a supply of the hafnium source gas, a first purging, a supply of the reaction gas, and a second purging.

For example, a process chamber in which the semiconductor substrate 10 is loaded may be supplied with the hafnium source gas to be adsorbed on the semiconductor substrate 10. The first purging may be performed to purge the hafnium source gas that is not absorbed. Thereafter, the process chamber may be supplied with the reaction gas to react with the hafnium source gas that is absorbed, and then the second purging may be performed to purge reaction byproducts and the reaction gas that is not reacted. Each of the first and second purging may use an inert gas (e.g., argon (Ar)) as a purging gas.

In an example embodiment, a doping process may be performed on the preliminary dielectric layer 31. For example, the preliminary dielectric layer 31 may be doped with a high-dielectric element. The high-dielectric element may include, for example, zirconium (Zr), aluminum (Al), yttrium (Y), scandium (Sc), lanthanum (La), cerium (Ce), dysprosium (Dy), tantalum (Ta), or the like. In an implementation, an ion size of the high-dielectric element may be greater than that of the hafnium atom.

In an example embodiment, the doping process may be performed contemporaneously with the formation of the preliminary dielectric layer 31. The preliminary dielectric layer 31 may be formed by, for example, an atomic layer deposition process that uses a hafnium source gas, a reaction gas, and a high-dielectric element source gas. The deposition cycle may include, for example, a hafnium cycle, which may be repeated one or more times, and a high-dielectric element cycle, which may be repeated one or more times. The hafnium cycle may include a supply of the hafnium source gas, a first purging, a supply of the reaction gas, and a second purging. The high-dielectric element cycle may include supplying the process chamber with the high-dielectric element source gas to be adsorbed on the semiconductor substrate 10, and supplying the process chamber with the reaction gas to react with the absorbed high-dielectric element source gas. In the deposition cycle, the number of times of the hafnium cycle and the high-dielectric element cycle may be controlled to adjust a content ratio of the high-dielectric element contained in the preliminary dielectric layer 31.

In an implementation, no doping may be performed on the preliminary dielectric layer 31.

Figure 2:
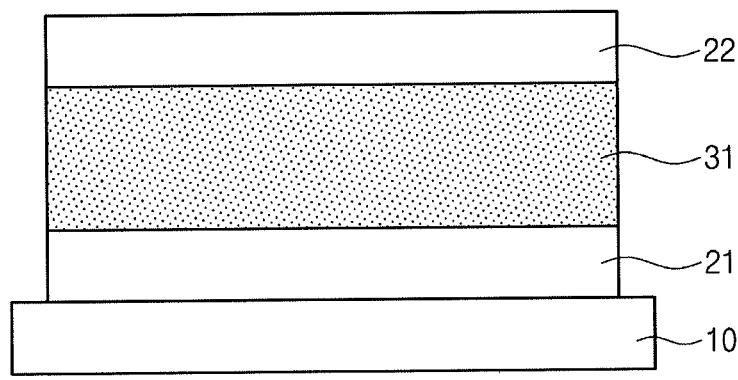

Referring to FIG. 2, a second electrode 22 may be formed on the preliminary dielectric layer 31. The second electrode 22 may be formed by an atomic layer deposition process, a sputtering process, an electron beam deposition process, a chemical vapor deposition process, a pulsed laser deposition process, or the like. The second electrode 22 may be formed to cover the preliminary dielectric layer 31. In an example embodiment, the second electrode 22 may include niobium nitride (NbN).

Figure 3:
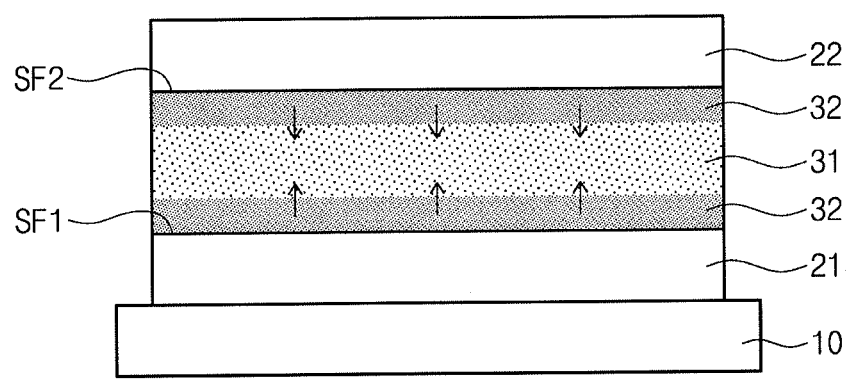
Figure 4:
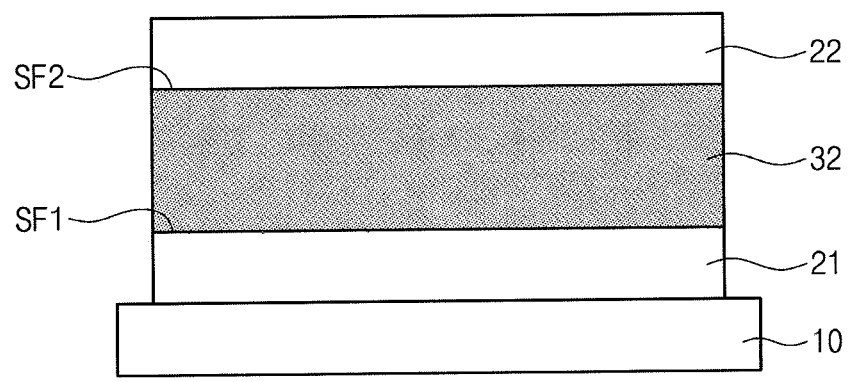

Referring to FIGS. 3 and 4, the preliminary dielectric layer 31 may be phase-changed into a dielectric layer 32. For example, a high interfacial energy may be obtained when niobium nitride (NbN) included in the first and second electrodes 21 and 22 is in contact with monoclinic hafnium oxide ($HfO_2$) included in the preliminary dielectric layer 31. For example, a lattice mismatch may be greater when niobium nitride (NbN) is in contact with monoclinic hafnium oxide ($HfO_2$) than when niobium nitride (NbN) is in contact with tetragonal hafnium oxide ($HfO_2$). Therefore, an interfacial energy may be less when niobium nitride (NbN) is in contact with tetragonal hafnium oxide ($HfO_2$) than when niobium nitride (NbN) is in contact with monoclinic hafnium oxide ($HfO_2$). As such, a high interfacial energy may be provided at an interface SF1 between the first electrode 21 and the preliminary dielectric layer 31 and at an interface SF2 between the second electrode 22 and the preliminary dielectric layer 31. In this case, the preliminary dielectric layer 31 may be phase-changed to reduce the interfacial energy at the interface SF1 between the first electrode 21 and the preliminary dielectric layer 31 and at the interface SF2 between the second electrode 22 and the preliminary dielectric layer 31. Although hafnium oxide ($HfO_2$) is most thermodynamically stable at the monoclinic crystalline phase, the high interfacial energy between the preliminary dielectric layer 31 and the first and second electrodes 21 and 22 may be used to drive the phase change of the preliminary dielectric layer 31 to a target crystalline phase. For example, where the first and second electrodes 21 and 22 are formed of niobium nitride (NbN), having a high interfacial energy when in contact with monoclinic hafnium oxide ($HfO_2$), the preliminary dielectric layer 31 may be phase-changed to have a crystalline phase whose dielectric constant is high. In an example embodiment, the preliminary dielectric layer 31 including monoclinic hafnium oxide ($HfO_2$) may be phase-changed into the dielectric layer 32 including tetragonal hafnium oxide ($HfO_2$). In example embodiments, monoclinic hafnium oxide ($HfO_2$) in the preliminary dielectric layer 31 may all be phase-changed, or a portion of monoclinic hafnium oxide ($HfO_2$) may be left and a remaining portion of monoclinic hafnium oxide ($HfO_2$) may be phase-changed. In the preliminary dielectric layer 31, monoclinic hafnium oxide ($HfO_2$) may be phase-changed at a ratio of about 70% to about 100%. Thus, in the dielectric layer 32, tetragonal hafnium oxide ($HfO_2$) may have a content amount of about 70% to about 100%.

As shown in FIG. 3, the preliminary dielectric layer 31 may be phase-changed from portions adjacent to the first and second electrodes 21 and 22. For example, the phase change of the preliminary dielectric layer 31 may begin at its surface in contact with the first electrode 21 and/or the second electrode 22 that are used as seeds. Thereafter, the phase change of the preliminary dielectric layer 31 may continue along directions indicated by arrows toward an inside thereof from the portions adjacent to the first and second electrodes 21 and 22, which may result in the formation of the dielectric layer 32 shown in FIG. 4.

According to an example embodiment, an annealing process may be performed to drive the phase change of the preliminary dielectric layer 31. For example, an annealing process may be used to accelerate the phase change and increase the phase change ratio of monoclinic hafnium oxide ($HfO_2$) in the preliminary dielectric layer 31.

Tetragonal hafnium oxide ($HfO_2$) may have a dielectric constant greater than that of monoclinic or amorphous hafnium oxide ($HfO_2$). Thus, according to an example embodiment, the dielectric layer 32 may have a greater dielectric constant than that of the preliminary dielectric layer 31. Thus, the first electrode 21, the dielectric layer 32, and the second electrode 22 may be formed as a capacitor having high capacitance. In an example embodiment, the first and second electrodes 21 and 22 may be disposed sufficiently spaced apart from each other, and accordingly the capacitor may exhibit a decreased leakage current. Thus, embodiments may provide a semiconductor device with improved electrical characteristics and increased stability.

In an example embodiment, an interfacial energy between the dielectric layer 32 and the first and second electrodes 21 and 22 may be used to prevent hafnium oxide ($HfO_2$) of the dielectric layer 32 from being phase-changed back to monoclinic crystallinity, which is more thermodynamically stable than tetragonal crystallinity.

When the preliminary dielectric layer 31 has an amorphous phase, a high interfacial energy may also be provided at the interface SF1 between the first electrode 21 and the preliminary dielectric layer 31 and at the interface SF2 between the second electrode 22 and the preliminary dielectric layer 31. In this case, when the preliminary dielectric layer 31 undergoes an annealing process, the preliminary dielectric layer 31 may be phase-changed into the dielectric layer 32 including tetragonal hafnium oxide ($HfO_2$).

Afterwards, the first electrode 21, the dielectric layer 32, and the second electrode 22 may be patterned along intended shapes. Through the processes above, a semiconductor device may be provided which has a capacitor including the first electrode 21, the dielectric layer 32, and the second electrode 22.

Figure 5:
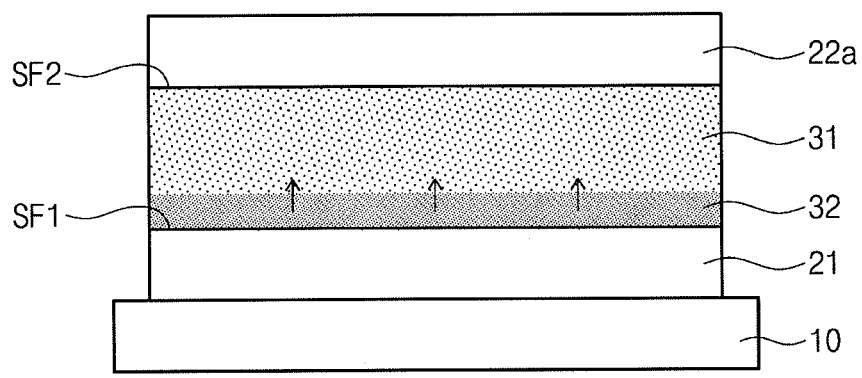
FIGS. 5 and 6 illustrate cross-sectional views showing a method of manufacturing a semiconductor device according to an example embodiment.
Figure 6:
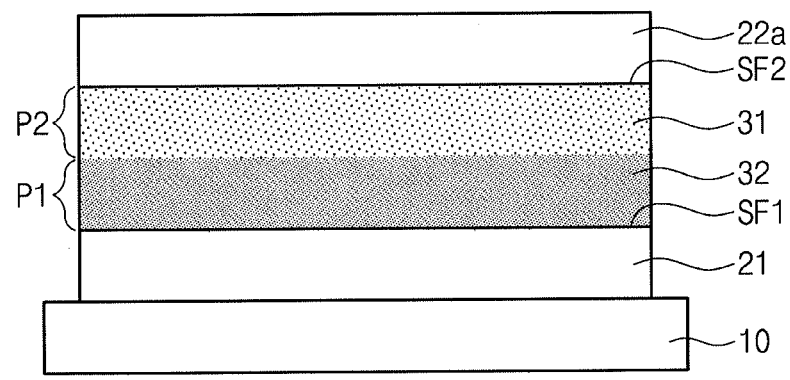

In an example embodiment, the second electrode 22 may include no niobium nitride (NbN). FIGS. 5 and 6 illustrate cross-sectional views showing a method of manufacturing a semiconductor device according to an example embodiment. A duplicate explanation will be omitted for convenience of description.

Referring to FIGS. 5 and 6, the preliminary dielectric layer 31 may be phase-changed in the step of FIG. 2. The first electrode 21 may include niobium nitride (NbN), and the second electrode 22 may include no niobium nitride (NbN). The interfacial energy at the interface SF1 between the first electrode 21 and the preliminary dielectric layer 31 may be greater than that at the interface SF2 between the second electrode 22 and the preliminary dielectric layer 31. When the preliminary dielectric layer 31 undergoes an annealing process, the preliminary dielectric layer 31 may be phase-changed to reduce the interfacial energy at the interface SF1 between the first electrode 21 and the preliminary dielectric layer 31.

As shown in FIG. 6, the phase change of the preliminary dielectric layer 31 may begin at a first portion P1 adjacent to the first electrode 21. Thereafter, the phase change of the preliminary dielectric layer 31 may continue along a direction indicated by an arrow from the first portion P1 toward an inside of the preliminary dielectric layer 31. After the annealing process, the first portion P1 adjacent to the first electrode 21 may be phase-changed into the dielectric layer 32, and a second portion P2 adjacent to the second electrode 22 may not be phase-changed. The phase change may reduce the interfacial energy at the interface SF1 between the first portion P1 and the first electrode 21.

According to an example embodiment, the first portion P1 where the dielectric layer 32 is formed may include tetragonal hafnium oxide ($HfO_2$), and the second portion P2 where the preliminary dielectric layer 31 remains may include monoclinic or amorphous hafnium oxide ($HfO_2$). The first portion P1 where the dielectric layer 32 is formed may have a dielectric constant greater than that of the second portion P2 where the preliminary dielectric layer 31 remains.

Figure 7:
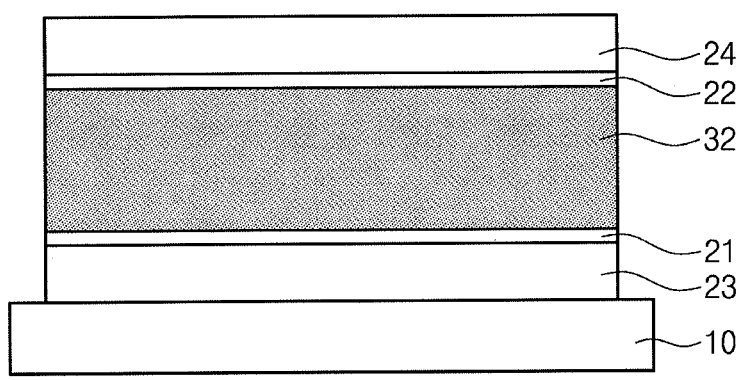
FIG. 7 illustrates a cross-sectional view showing a semiconductor device according to an example embodiment.

FIG. 7 illustrates a cross-sectional view showing a semiconductor device according to an example embodiment.

Referring to FIG. 7, a semiconductor device according to an example embodiment may include a first conductive layer 23 adjacent to the first electrode 21, and a second conductive layer 24 adjacent to the second electrode 22. The first and second electrodes 21, 22 may contact the dielectric layer 32 (or the preliminary dielectric layer 31). The first conductive layer 23 may be disposed on one surface of the first electrode 21, and the second conductive layer 24 may be disposed on one surface of the second electrode 22, each of which surfaces may stand opposite to the dielectric layer 32 (or the preliminary dielectric layer 31). Each of the first and second electrodes 21 and 22 may have a thickness that is less than that of each of the first and second conductive layers 23 and 24. Each of the first and second conductive layers 23 and 24 may have a conductivity that is greater than that of each of the first and second electrodes 21 and 22. The semiconductor device may exhibit improved electrical characteristics. In an example embodiment, the first and second conductive layers 23 and 24 may include titanium nitride (TiN).

Before the first electrode 21 is formed, the first conductive layer 23 may be formed on the semiconductor substrate 10, and after the second electrode 22 is formed, the second conductive layer 24 may be formed on the second electrode 22. The first and second conductive layers 23 and 24 may be formed by an atomic layer deposition process, a sputtering process, an electron beam deposition process, a chemical vapor deposition process, a pulsed laser deposition process, or the like.

In an example embodiment, the first and second conductive layers 23 and 24 may be formed embedded in the first and second electrodes 21 and 22, respectively.

FIGS. 8 to 11 illustrate cross-sectional views showing a method of manufacturing a semiconductor device according to an example embodiment.

Figure 8:
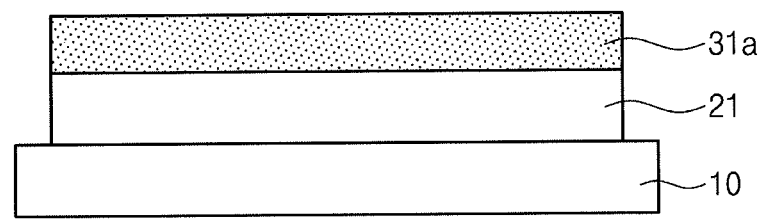
FIGS. 8 to 11 illustrate cross-sectional views showing a method of manufacturing a semiconductor device according to an example embodiment.

Referring to FIG. 8, a first electrode 21 may be formed on a semiconductor substrate 10. The first electrode 21 may be formed by an atomic layer deposition process, a sputtering process, an electron beam deposition process, a chemical vapor deposition process, a pulsed laser deposition process, or the like. In an example embodiment, the first electrode 21 may include niobium nitride (NbN).

A first preliminary dielectric layer 31a may be formed on the first electrode 21. A deposition process may be performed to form the first preliminary dielectric layer 31a. The first preliminary dielectric layer 31a may be formed by an atomic layer deposition process, a sputtering process, a pulsed laser deposition process, or an electron beam deposition process. In an example embodiment, the first preliminary dielectric layer 31a may include hafnium oxide ($HfO_2$). In an example embodiment, the first preliminary dielectric layer 31a may have a monoclinic crystalline phase or an amorphous phase.

Figure 9:
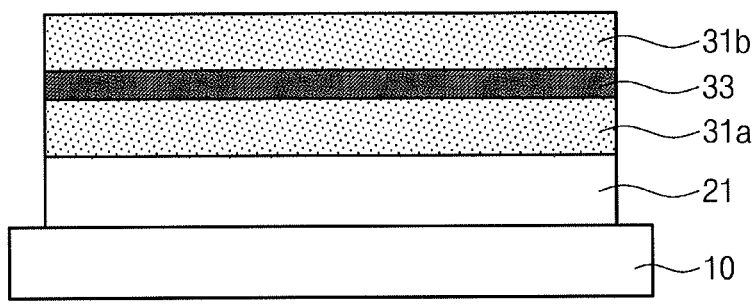

Referring to FIG. 9, a high-dielectric layer 33 may be formed on the first preliminary dielectric layer 31a. The high-dielectric layer 33 may be formed by an atomic layer deposition process, a sputtering process, an electron beam deposition process, a chemical vapor deposition process, a pulsed laser deposition process, or the like. The first preliminary dielectric layer 31a may separate the high-dielectric layer 33 from the first electrode 21. The high-dielectric layer 33 may have a dielectric constant greater than that of the first preliminary dielectric layer 31a and/or that of a second preliminary dielectric layer 31b which will be discussed below. In an example embodiment, the high-dielectric layer 33 may include zirconium oxide ($ZrO_2$), aluminum oxide ($Al_2O_3$), or a lanthanide.

A second preliminary dielectric layer 31b may be formed on the high-dielectric layer 33. A deposition process may be performed to form the second preliminary dielectric layer 31b. The second preliminary dielectric layer 31b may be formed by an atomic layer deposition process, a sputtering process, a pulsed laser deposition process, or an electron beam deposition process. In an example embodiment, the second preliminary dielectric layer 31b may include hafnium oxide ($HfO_2$). In an example embodiment, the second preliminary dielectric layer 31b may have a monoclinic crystalline phase or an amorphous phase.

Figure 10:
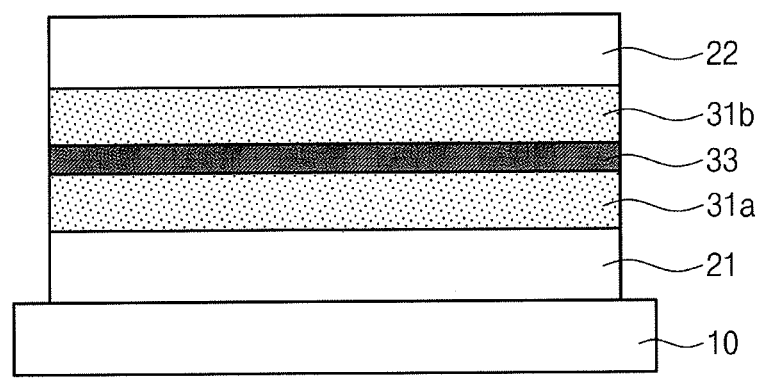

Referring to FIG. 10, a second electrode 22 may be formed on the second preliminary dielectric layer 31b. The second electrode 22 may be formed by an atomic layer deposition process, a sputtering process, an electron beam deposition process, a chemical vapor deposition process, a pulsed laser deposition process, or the like. The second preliminary dielectric layer 31b may separate the second electrode 22 from the high-dielectric layer 33. In an example embodiment, the second electrode 22 may include niobium nitride (NbN).

Figure 11:
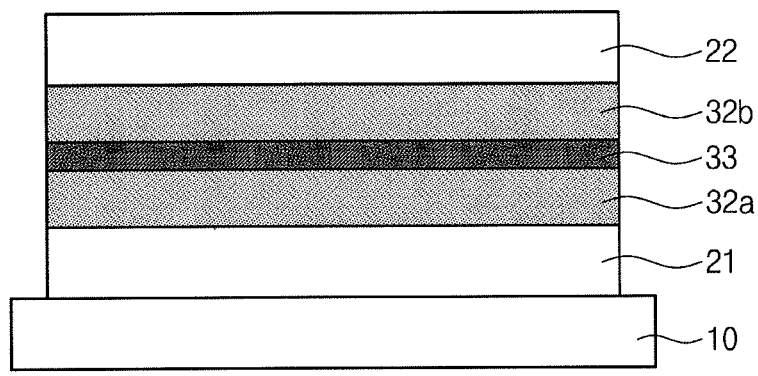

Referring to FIG. 11, the first preliminary dielectric layer 31a and the second preliminary dielectric layer 31b may be phase-changed into a first dielectric layer 32a and a second dielectric layer 32b, respectively. For example, an annealing process may be performed at a temperature of 400° C. to 600° C. and a time of about 2 hours. When the first and second preliminary dielectric layers 31a and 31b undergo an annealing process, the first and second preliminary dielectric layers 31a and 31b may be phase-changed. In an example embodiment, the phase change may reduce an interfacial energy at an interface between the first electrode 21 and the first preliminary dielectric layer 31a, and at an interface between the second electrode 22 and the second preliminary dielectric layer 31b. The phase change of the first preliminary dielectric layer 31a may begin from a portion adjacent to the first electrode 21, and the phase change of the second preliminary dielectric layer 31b may begin from a portion adjacent to the second electrode 22. Thereafter, the phase change of the first preliminary dielectric layer 31a may continue toward the high-dielectric layer 33 from the portion adjacent to the first electrode 21, and the phase change of the second preliminary dielectric layer 31b may continue toward the high-dielectric layer 33 from the portion adjacent to the second electrode 22.

In an example embodiment, the first electrode 21 may include niobium nitride (NbN), and the second electrode 22 may include no niobium nitride (NbN). The interfacial energy at the interface between the first electrode 21 and the first preliminary dielectric layer 31a may be greater than that at the interface between the second electrode 22 and the second preliminary dielectric layer 31b. In an example embodiment, the first preliminary dielectric layer 31a may be phase-changed into the first dielectric layer 32a, and the second preliminary dielectric layer 31b may not be phase-changed.

FIGS. 12 to 17 illustrate cross-sectional views showing a method of manufacturing a semiconductor device according to an example embodiment.

Figure 12:
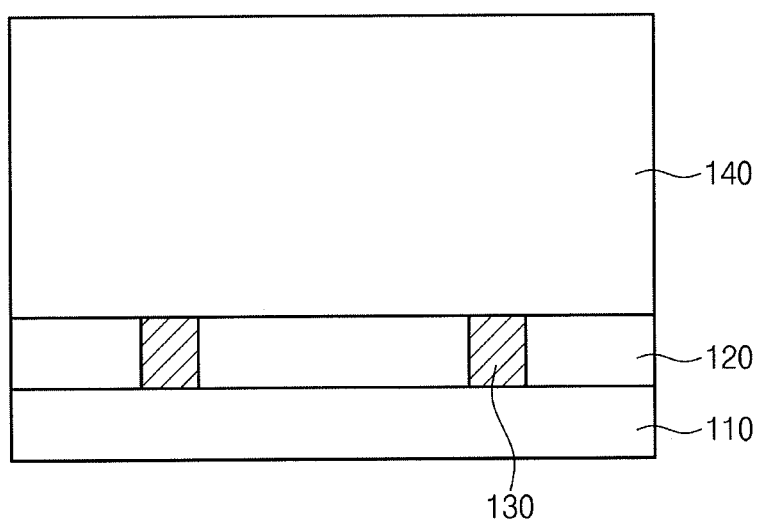
FIGS. 12 to 17 illustrate cross-sectional views showing a method of manufacturing a semiconductor device according to an example embodiment.

Referring to FIG. 12, a semiconductor substrate 110 may be provided. The semiconductor substrate 110 may be a semiconductor wafer (e.g., a silicon wafer), which may be formed to include a variety of semiconductor components.

An interlayer dielectric layer 120 may be formed on the semiconductor substrate 110. The interlayer dielectric layer 120 may be formed by, e.g., depositing silicon oxide or silicon nitride on the semiconductor substrate 110.

The interlayer dielectric layer 120 may be partially etched to form contact holes that partially expose a top surface of the semiconductor substrate 110, and then the contact holes may be filled with a conductive material to form contact plugs 130. In an implementation, an etch stop layer (not shown) may be formed on the interlayer dielectric layer 120, covering the interlayer dielectric layer 120 and the contact plugs 130.

A first sacrificial layer 140 may be formed on the interlayer dielectric layer 120. The first sacrificial layer 140 may be formed by a chemical vapor deposition process. The first sacrificial layer 140 may be formed to cover the interlayer dielectric layer 120 and the contact plugs 130. The first sacrificial layer 140 may have an etch selectivity with respect to the interlayer dielectric layer 120. The first sacrificial layer 140 may include an easily etched material. For example, the first sacrificial layer 140 may include BPSG, TOSZ, HDP, or PE-TEOS.

Figure 13:
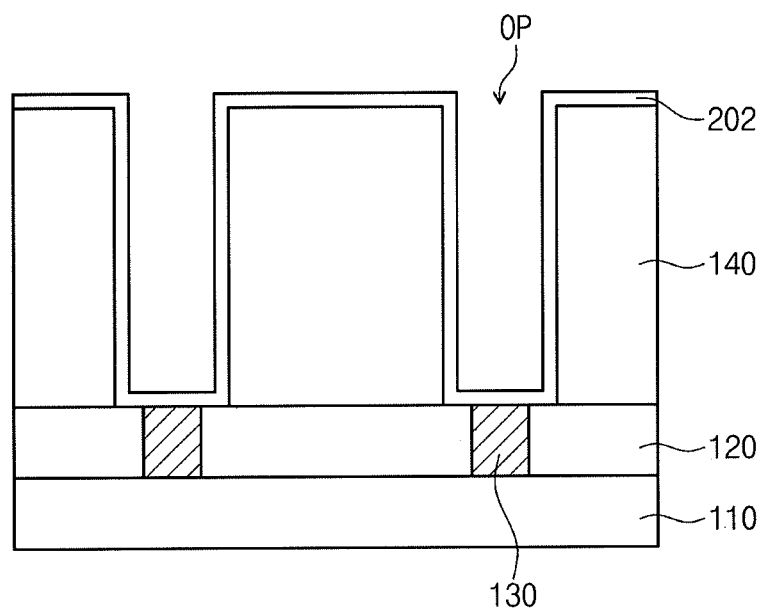

Referring to FIG. 13, the first sacrificial layer 140 may be partially etched to form openings OP that expose top surfaces of the contact plugs 130. Each of the openings OP may have a width the same as or greater than that of each of the contact plugs 130.

A first electrode layer 202 may be formed on the first sacrificial layer 140. The first electrode layer 202 may be formed along a top surface of the first sacrificial layer 140 and along inner and bottom surfaces of the openings OP. The first electrode layer 202 may conformally cover the top surface of the first sacrificial layer 140 and the inner and bottom surfaces of the openings OP. The first electrode layer 202 may not completely fill the openings OP. In an example embodiment, the first electrode layer 202 may include niobium nitride (NbN).

Figure 14:
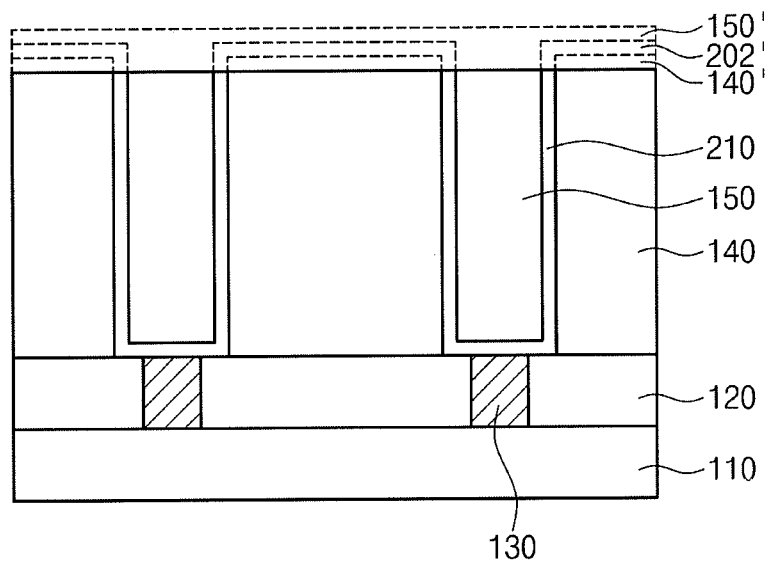

Referring to FIG. 14, a second sacrificial layer 150 may be formed on the first electrode layer (see 202 of FIG. 13). For example, on the first electrode layer 202, the second sacrificial layer 150 may fill the openings OP. The second sacrificial layer 150 may be formed by, e.g., a chemical vapor deposition process. The second sacrificial layer 150 may include, e.g., BPSG, TOSZ, HDP, or PE-TEOS.

Thereafter, a portion 202' of the first electrode layer (see 202 of FIG. 13) may be removed. For example, the semiconductor substrate 110 may undergo a grinding process to remove a portion 140' of the first sacrificial layer 140, the portion 202' of the first electrode layer 202, and a portion 150' of the second sacrificial layer 150. In this step, the portion 202' of the first electrode layer 202 may be removed from the top surface of the first sacrificial layer 140, and thus first electrodes 210 may be formed. The first electrodes 210 may remain in the openings OP.

Figure 15:
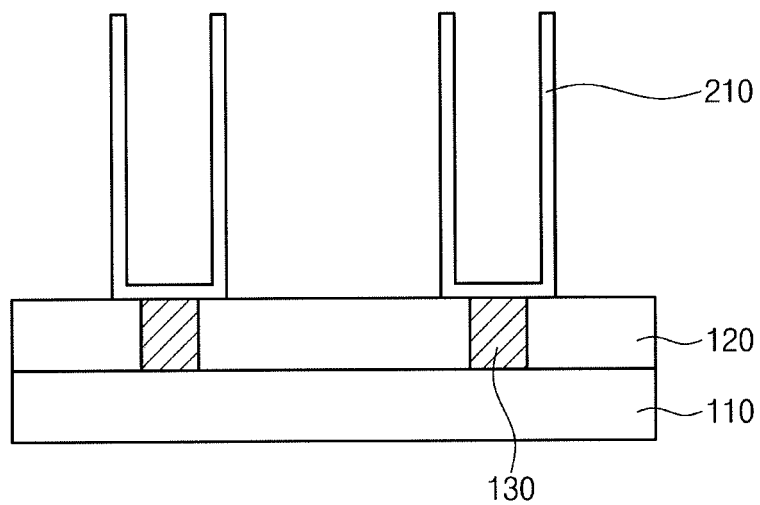

Referring to FIG. 15, the first and second sacrificial layers 140 and 150 may be removed. For example, a wet etching process may be performed to remove the first and second sacrificial layers 140 and 150. The removal of the first and second sacrificial layers 140 and 150 may expose inner and outer walls of the first electrodes 210. The first electrodes 210 may have cylindrical shapes.

Figure 16:
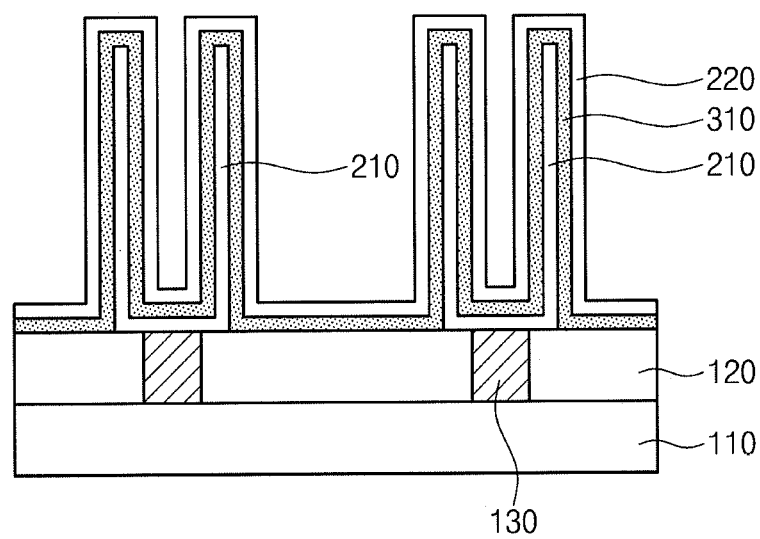

Referring to FIG. 16, a preliminary dielectric layer 310 may be formed on the semiconductor substrate 110. A deposition process may be performed to form the preliminary dielectric layer 310. The preliminary dielectric layer 310 may be formed by, e.g., an atomic layer deposition process, a sputtering process, a pulsed laser deposition process, or an electron beam deposition process. The preliminary dielectric layer 310 may be conformally formed along shapes of the first electrodes 210, while covering a top surface of the interlayer dielectric layer 120. For example, the preliminary dielectric layer 310 may cover the inner and outer walls of the first electrodes 210. The preliminary dielectric layer 310 may not completely fill insides of the first electrodes 210. In an example embodiment, the preliminary dielectric layer 310 may include hafnium oxide ($HfO_2$). In an example embodiment, the preliminary dielectric layer 310 may have a monoclinic crystalline phase or an amorphous phase.

A second electrode 220 may be formed on the preliminary dielectric layer 310. The second electrode 220 may be formed by, e.g., an atomic layer deposition process, a sputtering process, an electron beam deposition process, a chemical vapor deposition process, or a pulsed laser deposition process. The second electrode 220 may cover the first electrodes 210. The second electrode 220 may be a common counter electrode to the first electrodes 210. In an example embodiment, the second electrode 220 may include niobium nitride (NbN).

Figure 17:
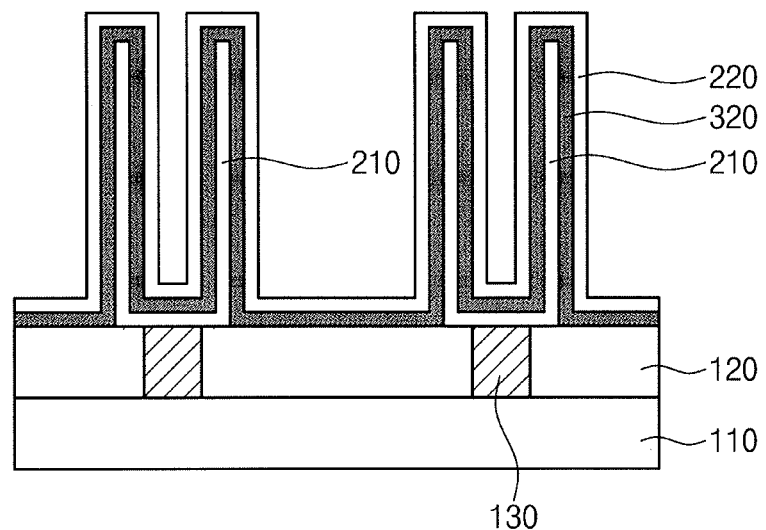

Referring to FIG. 17, the preliminary dielectric layer 310 may be phase-changed to form a dielectric layer 320. When the preliminary dielectric layer 310 undergoes an annealing process, the preliminary dielectric layer 310 may be phase-changed. The phase change may reduce an interfacial energy at an interface between the first electrode 210 and the preliminary dielectric layer 310 and at an interface between the second electrode 220 and the preliminary dielectric layer 310. In an example embodiment, the preliminary dielectric layer 310 including monoclinic hafnium oxide ($HfO_2$) may be phase-changed into the dielectric layer 320 including tetragonal hafnium oxide ($HfO_2$). The dielectric layer 320 may have a dielectric constant greater than that of the preliminary dielectric layer 310.

Through the processes above, a semiconductor device may be provided which has a capacitor including the first electrode 210, the dielectric layer 320, and the second electrode 220.

EXPERIMENTAL EXAMPLE 1

Method

When manufacturing a semiconductor device like that shown in FIG. 4, first and second electrodes were formed of niobium nitride (NbN) and a preliminary dielectric layer was formed of hafnium oxide ($HfO_2$). The preliminary dielectric layer was formed of monoclinic hafnium oxide ($HfO_2$) having a relatively low thermodynamic energy. Afterwards, an annealing process was performed to phase change the preliminary dielectric layer into a dielectric layer having tetragonal hafnium oxide ($HfO_2$).

EXPERIMENTAL EXAMPLE 1

Analysis

Figure 18:
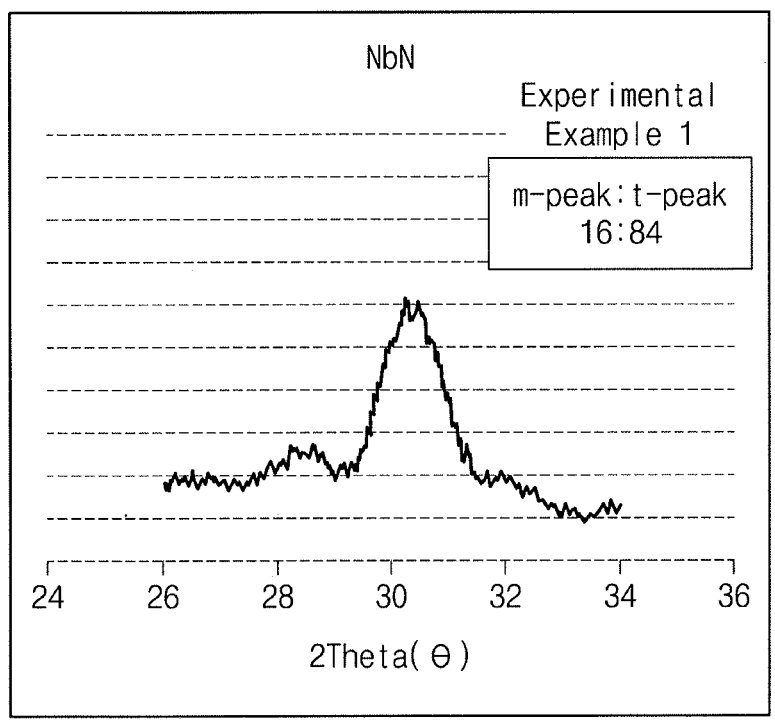
FIG. 18 illustrates a graph showing XRD results of a dielectric layer in Experimental Example 1.

FIG. 18 illustrates a graph showing XRD results of the dielectric layer in Experimental Example 1.

As shown in FIG. 18, in Experimental Example 1 (in which the first and second electrodes are formed of niobium nitride (NbN)), about 84% of the preliminary dielectric layer was phase-changed from a monoclinic crystalline phase into a tetragonal crystalline phase. Tetragonal hafnium oxide ($HfO_2$) has a greater dielectric constant than that of monoclinic hafnium oxide ($HfO_2$). Thus, the preliminary dielectric layer may be phase-changed into tetragonal crystallinity at a high ratio, and Experimental Example 1 shows that it is possible to form a capacitor whose capacitance is high.

EXPERIMENTAL EXAMPLE 2

Method

When manufacturing a semiconductor device like that shown in FIG. 11, a first electrode was formed of niobium nitride (NbN), a second electrode was formed of titanium nitride (TiN), first and second preliminary dielectric layers were formed of hafnium oxide ($HfO_2$), and a high-dielectric layer between the first and second preliminary dielectric layers was formed of zirconium oxide ($ZrO_2$). Afterwards, an annealing process was performed to phase-change the first preliminary dielectric layer, which is adjacent to the first electrode including niobium nitride (NbN), into a first dielectric layer.

EXPERIMENTAL EXAMPLE 3

Method

When manufacturing a semiconductor device like that in Experimental Example 2, first and second electrodes were formed of niobium nitride (NbN), first and second preliminary dielectric layers were formed of hafnium oxide ($HfO_2$), and a high-dielectric layer between the first and second preliminary dielectric layers was formed of zirconium oxide ($ZrO_2$). Thereafter, an annealing process was performed to phase-change the first preliminary dielectric layer and the second preliminary dielectric layer into a first dielectric layer and a second dielectric layer.

EXPERIMENTAL EXAMPLES 2 AND 3

Analysis

Figure 19:
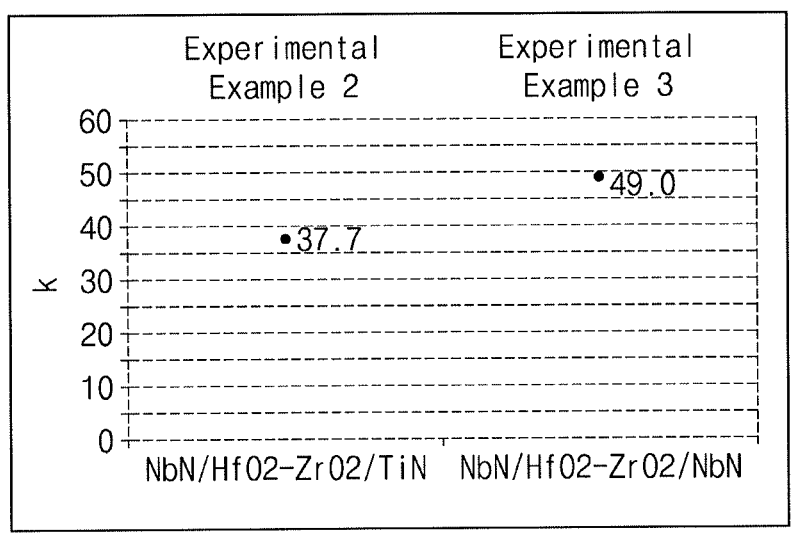
FIG. 19 illustrates a graph showing dielectric constants measured in Experimental Examples 2 and 3.

FIG. 19 illustrates a graph showing dielectric constants measured in Experimental Examples 2 and 3.

As shown in FIG. 19, it may be seen that a dielectric constant of Experimental Example 3 is greater than that of Experimental Experiment 2. Titanium nitride (TiN) was used to form the second electrode in Experimental Example 2, and niobium nitride (NbN) was used to form the second electrode in Experimental Example 3. Thus, an amount of tetragonal hafnium oxide ($HfO_2$) in the second dielectric layer of Experimental Example 3 may be greater than that of tetragonal hafnium oxide ($HfO_2$) in the second preliminary dielectric layer of Experimental Example 2. Thus, hafnium oxide ($HfO_2$) of the preliminary dielectric layer may be phase-changed from a monoclinic crystalline phase into a tetragonal crystalline phase, and a high dielectric constant may be provided in a semiconductor device.

In a method of manufacturing semiconductor devices according to an example embodiment, a high interfacial energy between an electrode and a preliminary dielectric layer may be used to cause the preliminary dielectric layer to easily phase-change into a target crystalline phase. For example, the electrode may be formed of niobium nitride (NbN) that has a high interfacial energy when in contact with monoclinic hafnium oxide ($HfO_2$), and accordingly it may be easy to phase-change the preliminary dielectric layer to have a crystalline phase whose dielectric constant is high.

By way of summation and review, dielectric layers may have various uses in semiconductor devices. For example, dielectric layers may be used in insulating conductors, as gate dielectric layers of transistors, or as capacitor dielectric layers. It is desired that dielectric layers have superior properties to improve characteristics of semiconductor devices.

As described above, embodiments relate to a semiconductor device having a capacitor and a method of manufacturing the same. Embodiments may provide a semiconductor device with improved electrical characteristics and a method of manufacturing the same.

According to an example embodiment, a semiconductor device may include a dielectric layer whose dielectric constant is high and may have a capacitor whose capacitance is high. In addition, the capacitor may decrease in leak current.

In conclusion, according to methods of the present inventive concepts, it may be possible to provide semiconductor devices with improved electrical characteristics and increased stability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
    forming a first electrode;
    forming a preliminary dielectric layer on the first electrode;
    forming a second electrode on the preliminary dielectric layer; and
    at least partially phase-changing the preliminary dielectric layer to form a dielectric layer, an interfacial energy between the first electrode and the dielectric layer being less than an interfacial energy between the first electrode and the preliminary dielectric layer.

2. The method as claimed in claim 1, wherein:
    one or more of the first electrode or the second electrode includes niobium nitride, and
    the preliminary dielectric layer and the dielectric layer include hafnium oxide.

3. The method as claimed in claim 2, wherein:
    the preliminary dielectric layer has a monoclinic crystalline phase or an amorphous phase hafnium oxide, and
    the dielectric layer has a tetragonal crystalline phase hafnium oxide.

4. The method as claimed in claim 1, wherein a dielectric constant of the dielectric layer is greater than a dielectric constant of the preliminary dielectric layer.

5. The method as claimed in claim 1, wherein the preliminary dielectric layer contacts the first electrode and the second electrode.

6. The method as claimed in claim 1, wherein phase-changing of the preliminary dielectric layer continues toward an inside of the preliminary dielectric layer from one or more of a first interface between the preliminary dielectric layer and the first electrode or a second interface between the preliminary dielectric layer and the second electrode.

7. The method as claimed in claim 1, wherein phase-changing of the preliminary dielectric layer includes performing an annealing process.

8. The method as claimed in claim 1, further comprising one or more of:
    doping the preliminary dielectric layer with a high-dielectric element; and
    doping the dielectric layer with the high-dielectric element.

9. The method as claimed in claim 8, wherein the high-dielectric element includes one or more of zirconium, aluminum, yttrium, scandium, lanthanum, cerium, dysprosium, or tantalum.

10. The method as claimed in claim 1, further comprising forming a high-dielectric layer embedded in the preliminary dielectric layer,
    wherein the preliminary dielectric layer separates the high-dielectric layer from the first electrode and the second electrode.

11. The method as claimed in claim 10, wherein the high-dielectric layer includes one or more of zirconium oxide, aluminum oxide, or a lanthanide.

12. A semiconductor device, comprising:
    a first electrode;
    a second electrode on the first electrode; and
    a dielectric layer between the first electrode and the second electrode, the dielectric layer including a first portion adjacent to the first electrode, and a second portion adjacent to the second electrode, the first portion and the second portion having different crystalline phases from each other, wherein an interfacial energy between the first electrode and the first portion of the dielectric layer is less than an interfacial energy between the second electrode and the second portion of the dielectric layer.

13. The semiconductor device as claimed in claim 12, wherein a dielectric constant of the first portion is greater than a dielectric constant of the second portion.

14. The semiconductor device as claimed in claim 12, wherein:
    the first portion of the dielectric layer includes tetragonal hafnium oxide, and
    the second portion of the dielectric layer includes monoclinic or amorphous hafnium oxide.

15. The semiconductor device as claimed in claim 12, wherein:
    the first electrode and the second electrode include different materials from each other, and
    the first electrode includes niobium nitride.

16. The semiconductor device as claimed in claim 12, wherein a thickness of the dielectric layer is about 1 nm to about 10 nm.

17. The semiconductor device as claimed in claim 12, wherein:
    the dielectric layer further includes a high-dielectric layer between the first portion and the second portion,
    a dielectric constant of the high-dielectric layer is greater than a dielectric constant of the first portion, and
    the dielectric constant of the high-dielectric layer is greater than a dielectric constant of the second portion.

18. The semiconductor device as claimed in claim 12, further comprising a conductive layer,
    wherein the conductive layer is embedded in the first electrode, or is disposed on one surface of the first electrode, the one surface standing opposite to the dielectric layer.

19. The semiconductor device as claimed in claim 18, wherein the conductive layer includes titanium nitride.

* * * * *